United States Patent
Lu et al.

(10) Patent No.: US 9,588,419 B2
(45) Date of Patent: Mar. 7, 2017

(54) EXTREME ULTRAVIOLET LIGHT (EUV) PHOTOMASKS AND FABRICATION METHODS THEREOF

(71) Applicant: Taiwan Semiconductor Manufacturing Company, Ltd., Hsin-Chu (TW)

(72) Inventors: Yen-Cheng Lu, New Taipei (TW); Chih-Tsung Shih, Hsin-Chu (TW); Shinn-Sheng Yu, Hsin-Chu (TW); Jeng-Horng Chen, Hsin-Chu (TW); Anthony Yen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 29 days.

(21) Appl. No.: 14/810,197

(22) Filed: Jul. 27, 2015

(65) Prior Publication Data
US 2015/0331307 A1 Nov. 19, 2015

Related U.S. Application Data

(63) Continuation of application No. 13/946,741, filed on Jul. 19, 2013, now Pat. No. 9,091,947.

(51) Int. Cl.
*G03F 1/22* (2012.01)
*G03F 1/24* (2012.01)
*G03F 1/80* (2012.01)
*G03F 1/52* (2012.01)

(52) U.S. Cl.
CPC .............. *G03F 1/80* (2013.01); *G03F 1/22* (2013.01); *G03F 1/24* (2013.01); *G03F 1/52* (2013.01)

(58) Field of Classification Search
CPC ..... G03F 1/22; G03F 1/24; G03F 1/54; G03F 1/58
USPC .......................................................... 430/5
See application file for complete search history.

(56) References Cited

U.S. PATENT DOCUMENTS

2003/0039894 A1 2/2003 Yan et al.
2012/0045712 A1 2/2012 Chang et al.

*Primary Examiner* — Stephen Rosasco
(74) *Attorney, Agent, or Firm* — Slater Matsil, LLP (57) ABSTRACT

Embodiments of EUV photomasks and methods for forming a EUV photomask are provided. The method comprises providing a substrate, a reflective layer, a capping layer, a hard mask layer, and forming an opening therein. An absorber layer is then filled in the opening and over the top surface of the hard mask layer. A removing process is provided to form an absorber with a top surface lower than a top surface of the capping layer.

20 Claims, 5 Drawing Sheets

EXTREME ULTRAVIOLET LIGHT (EUV) PHOTOMASKS AND FABRICATION METHODS THEREOF

PRIORITY CLAIM

This application is a continuation of and claims priority to U.S. patent application Ser. No. 13/946,741, filed Jul. 19, 2013, and entitled, "Extreme Ultraviolet Light (EUV) Photomasks and Fabrication Methods Thereof," which application is incorporated herein by reference.

FIELD OF THE INVENTION

The present disclosure relates generally to the field of photomasks used in the fabrication of semiconductor devices, and more particularly, to extreme ultraviolet light (EUV) photomasks, and fabrication methods thereof.

BACKGROUND

In the manufacture of integrated circuits (IC), or chips, patterns representing different layers of the chip are created on a series of reusable photomasks (also referred to herein as masks) in order to transfer the design of each chip layer onto a semiconductor substrate during the manufacturing process. The masks are used much like photographic negatives to transfer the circuit patterns for each layer onto a semiconductor substrate. These layers are built up using a sequence of processes and translate into the tiny transistors and electrical circuits that comprise each completed chip. Thus, any defects in the mask may be transferred to the chip, potentially adversely affecting performance. Defects that are severe enough may render the mask completely useless. Typically, a set of 15 to 30 masks is used to construct a chip and can be used repeatedly.

A mask generally comprises a transparent substrate having an opaque, light-absorbing layer disposed thereon. Conventional masks typically include a glass or quartz substrate having a layer of chromium on one side. The chromium layer is covered with an anti-reflective coating and a photosensitive resist. During a patterning process, the circuit design is written onto the mask, for example, by exposing portions of the resist to an electron beam or ultraviolet light, thereby making the exposed portions soluble in a developing solution. The soluble portion of the resist is then removed, allowing the exposed underlying chromium and anti-reflective layers to be etched (i.e., removed).

With the shrink of critical dimensions (CD), present optical lithography is approaching a technological limit at the 28 nanometers (nm) technology node. Next generation lithography (NGL) is expected to replace the current optical lithography method, for example, in the 22 nm technology node and beyond. There are several NGL candidates such as extreme ultraviolet (EUV) lithography (EUVL), electron projection lithography (EPL), ion projection lithography (IPL), nanoimprint, and X-ray lithography. Of these, EUVL is the most likely successor due to the fact that EUVL has most of the properties of optical lithography, which is a more mature technology as compared with other NGL methods.

However, EUV mask fabrication still has technological challenges to overcome. For example, pellicle is used in the conventional chromium masks to prevent any unwanted dusts on the mask to be transferred to the chip. However, pellicle is not feasible to the EUV mask because it will absorb the EUV light. Hence, there is a need to clean the surface of the EUV masks without a pellicle thereon. In addition, there is still a need to monitor the dusts on the surface of the EUV masks.

Thus, there is a need for improved EUV masks and fabrication methods.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is understood that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Figure 1:
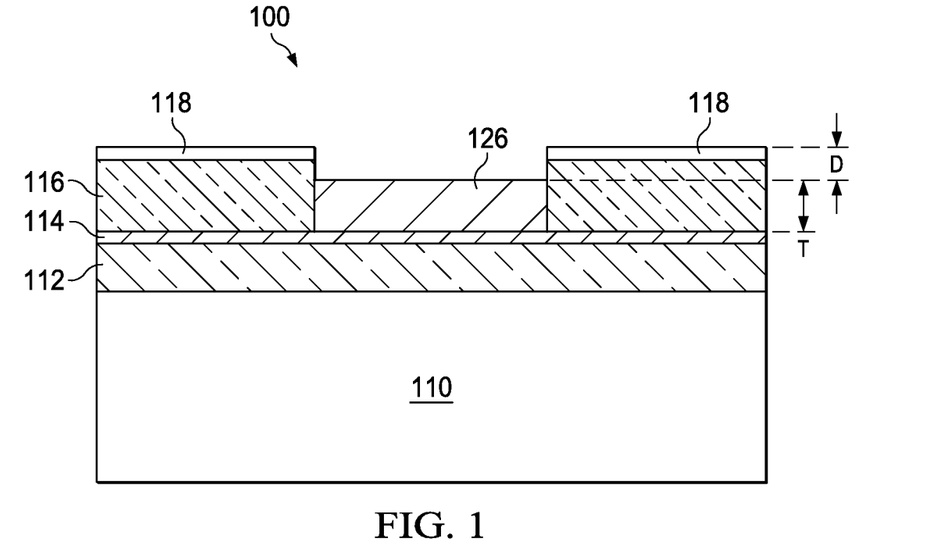
FIG. 1 is a schematic cross-sectional view illustrating an exemplary EUV mask.

FIG. 1 is a schematic cross-sectional view illustrating an EUV photomask 100. In some embodiments, the EUV photomask 100 include a substrate 110, a first reflective layer 112 on the substrate 110, an intervening layer 114 on the first reflective layer 112, a second reflective layer 116 on the intervening layer 114, a capping layer 118 on the second reflective layer 116, and an absorber 126 in an opening penetrating the capping layer 118 and at least a portion of the second reflective layer 116. In some embodiments, the absorber 126 has a top surface lower than the top surface of the capping layer 118. In the present embodiment, the absorber 126 has a top surface lower than the top surface of the second reflective layer 116.

The substrate 110 may be any size suitable for use as a photomask. In one embodiment, the substrate 110 has a rectangular shape with sides between about 5 inches to about 9 inches in length. In another embodiment, the substrate 110 has a thickness ranging about 0.15 inches and about 0.25 inches. In other embodiment, the substrate 110 is about 0.25 inches thick. In some embodiments, the substrate 110 has a low thermal expansion coefficient (specifically 0±0.05×10−7/o C., particularly preferably 0±0.03×10−7/o C. at 20o C.), and be excellent in smoothness, flatness and durability to a cleaning liquid used for cleaning the mask blank or the photomask after the formation of a pattern. The substrate 110 typically comprises a silicon-based material having low thermal expansion coefficient, such as quartz (i.e., silicon dioxide, SiO2), and the like.

The first reflective layer 112 can achieve a high reflectivity to EUV light. For example, the first reflective layer 112 has reflectivity up to 65 40% when the surface of the first reflective layer 112 is irradiated by the EUV light having wavelength of around 13.5 nm. In the present embodiment, a multilayered reflective film formed by laminating alternately a layer of high refractive index and a layer of low refractive index plural times is employed as the first reflective layer 112. In some embodiments, Mo is employed for the layer of low refractive index and Si is used for the layer of high refractive index for forming the multilayered reflective film of the first reflective layer 112. Namely, a Mo/Si multilayered reflective film is formed for forming the first reflective layer 112. In one embodiment, the first reflective layer 112 may comprise alternating Mo and Si layers ranging between about 20 pairs and about 40 pairs. Each pair of the Mo and Si layers may comprise a Mo layer with a thickness of about 3 nm and a Si layer with a thickness of about 4 nm.

In alternative embodiments, the multilayered reflective film is a Ru/Si multilayered reflective film, a Mo/Be multilayered reflective film, a Mo compound/Si compound multilayered reflective film, a Si/Mo/Ru multilayered reflective film, a Si/Mo/Ru/Mo multilayered reflective film or a Si/Ru/Mo/Ru multilayered reflective film.

The intervening layer 114 acts as an etch stop layer when forming the opening in the second reflective layer 116 by an etching process. In some embodiments, an etching selectivity between the second reflective layer 116 and the intervening layer 114 during the etching process for forming the opening is greater than about 10. In some embodiments, the intervening layer 114 includes Cr, Ru, or combinations thereof.

The second reflective layer 116 can achieve a high reflectivity to EUV light. For example, the second reflective layer 116 has reflectivity up to 40% when the surface of the second reflective layer 116 is irradiated by the EUV light having wavelength of around 13.5 nm. In the present embodiment, a multilayered reflective film formed by laminating alternately a layer of high refractive index and a layer of low refractive index plural times is employed as the second reflective layer 116. In the present embodiment, the second reflective layer 116 includes the multilayered reflective film same as the first reflective layer 112, e.g., Mo/Si multilayered reflective film. In some embodiments, a ratio of the thickness of the second reflective layer 116 to the thickness of the first reflective layer 112 is ranging between about 0.25 and about 1. The second reflective layer 116 may comprise alternating Mo and Si layers ranging between about 10 pairs and about 20 pairs. Each pair of the Mo and Si layers may comprise a Mo layer with a thickness of about 3 nm and a Si layer with a thickness of about 4 nm. In the present embodiment, the total thickness of the second reflective layer 116 and the first reflective layer 112 is ranging between about 200 nm and about 400 nm.

The capping layer 118 acts as a capping layer and/or a buffer layer between the second reflective layer 116 and a hard mask layer present in an intermediate process for forming photomask. In some embodiments, the capping layer 118 is a silicon (Si) layer, ruthenium (Ru) layer, or Ru-containing layer. The capping layer 118, for example, has a thickness ranging between about 1 nm and about 10 nm.

In some embodiments, the absorber 126 has a bottom surface that contacts the top surface of the intervening layer 114 and has a top surface lower than the top surface of the capping layer 118. A height difference D is present between the top surfaces of the absorber 126 and the capping layer 118. In some embodiments, the height difference D is greater than about 20 nm to ensure the particles on the absorber 126 are trapped strongly during wafer lithography process. In the present embodiment, the height difference D ranges between about 20 nm and about 50 nm. The absorber 126 has a thickness T. In some embodiments, the thickness T is greater than about 20 nm to prevent light leakage or poor contrast during a wafer lithography process. In an alternative embodiment, the thickness T is less than about 150 nm to prevent the difficulty of fabricating the mask. In the present embodiment, the thickness T ranges between about 20 nm and about 150 nm.

The absorber 126 is an opaque, light-shielding layer. In one embodiment, the absorber 126 comprises tantalum-based materials with essentially no oxygen, such as tantalum silicide-based materials (hereinafter TaSi), nitrogenized tantalum boride-based materials (hereinafter TaBN), and tantalum nitride-based materials (hereinafter TaN). In another embodiment, the absorber 126 comprises tantalum- and oxygen-based materials, such as oxidized and nitrogenized tantalum and silicon-based materials (hereinafter TaSiON), tantalum boron oxide-based materials (hereinafter TaBO), and oxidized and nitrogenized tantalum-based materials (hereinafter TaON).

FIGS. 2-8 are schematic cross-sectional views illustrating an exemplary process flow for forming an EUV photomask. Items of FIGS. 2-8 that are the same items in FIG. 1 are indicated by the same reference numerals, increased by 100. With reference to FIGS. 2-8 and 9, an EUV photomask 200 and a method 300 are collectively described below.

Figure 2:
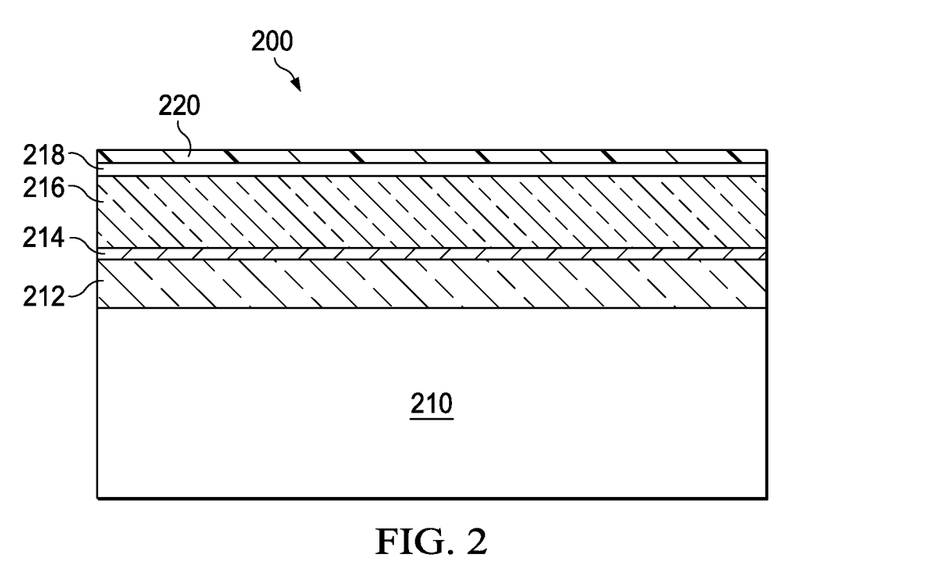
FIGS. 2-8 are various cross-sectional views of embodiments of an EUV mask during various fabrication stages.
Figure 9:
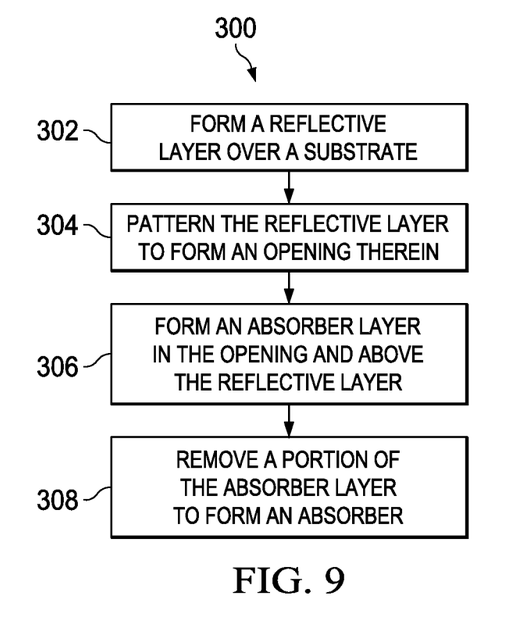
FIG. 9 is a flow chart of a method for fabricating an EUV mask according to aspects of the present disclosure.

Referring to FIGS. 2 and 9, the method 300 begins at step 302 wherein a first reflective layer 212 is formed over a substrate 210. In some embodiments, an intervening layer 214 is formed on the first reflective layer 212, a second reflective layer 216 is formed on the intervening layer 214, and a capping layer 218 is formed over the second reflective layer 216. In some embodiments, a hard mask layer 220 is formed over the capping layer 218. In some embodiments, the substrate 210 is a rectangular shape substrate with sides ranging between about 5 inches and about 9 inches in length and has a thickness ranging between about 0.15 inches and 0.25 inches. In some embodiments, the substrate 210 has a low thermal expansion coefficient (specifically 0±0.05×10−7/o C., particularly preferably 0±0.03×10−7/o C. at 20o C.), and be excellent in smoothness, flatness and durability to a cleaning liquid used for cleaning the mask blank or the photomask after the formation of a pattern. The substrate 210 typically includes a silicon-based material having low thermal expansion coefficient, such as quartz (i.e., silicon dioxide, SiO2), and the like.

The first reflective layer 212 can achieve a high reflectivity to EUV light. For example, the first reflective layer 212 has reflectivity up to 40% when the surface of the first reflective layer 212 is irradiated by the EUV light having wavelength of around 13.5 nm. In some embodiments, the first reflective layer 212 is a multi-material layer. In some embodiments, the multilayered reflective film is formed by laminating alternately a layer of high refractive index and a layer of low refractive index plural times. In the present embodiment, Mo is employed for the layer of low refractive index and Si is used for the layer of high refractive index for forming the multilayered reflective film of the first reflective layer 212. Namely, a Mo/Si multilayered reflective film is formed for forming the first reflective layer 212. In one embodiment, the first reflective layer 212 may comprise alternating Mo and Si layers ranging between about 20 pairs and about 40 pairs. Each pair of the Mo and Si layers may comprise a Mo layer with a thickness of about 3 nm and a Si layer with a thickness of about 4 nm.

In alternative embodiments, the multilayered reflective film is a Ru/Si multilayered reflective film, a Mo/Be multilayered reflective film, a Mo compound/Si compound multilayered reflective film, a Si/Mo/Ru multilayered reflective film, a Si/Mo/Ru/Mo multilayered reflective film or a Si/Ru/Mo/Ru multilayered reflective film. In some embodiments, the first reflective layer 212 is formed by a deposition process, including chemical vapor deposition (CVD), physical vapor deposition (PVD), atomic layer deposition (ALD), and/or other suitable process.

The intervening layer 214 may function as an etch stop layer during a subsequent etching process. In some embodiments, the intervening layer 214 includes Cr, Ru, or a combination thereof. In the present embodiment, the intervening layer 214 has a thickness ranging between about 2 nm and about 7 nm. In alternative embodiments, the intervening layer 214 has a thickness about 2.5 nm. In some embodiments, the intervening layer 214 is formed by a deposition process, including CVD, PVD, ALD, and/or other suitable process.

The second reflective layer 216 can achieve a high reflectivity to EUV light. For example, the second reflective layer 216 has reflectivity up to 30% when the surface of the second reflective layer 216 is irradiated by the EUV light having wavelength of around 13.5 nm. In the present embodiment, a multilayered reflective film formed by laminating alternately a layer of high refractive index and a layer of low refractive index plural times is employed as the second reflective layer 216. In the present embodiment, the second reflective layer 216 includes the multilayered reflective film same as the first reflective layer 212, e.g., Mo/Si multilayered reflective film. In some embodiments, a ratio of the thickness of the second reflective layer 216 to the thickness of the first reflective layer 212 ranges between about 0.25 and about 1.

The second reflective layer 216 may comprise alternating Mo and Si layers ranging between about 10 pairs and about 20 pairs. Each pair of the Mo and Si layers may comprise a Mo layer with a thickness of about 3 nm and a Si layer with a thickness of about 4 nm. In the present embodiment, the total thickness of the second reflective layer 216 and the first reflective layer 212 is ranging between about 200 nm and about 400 nm.

The capping layer 218 may function as a capping layer and/or a buffer layer interposed between the second reflective layer 216 and the hard mask layer 220. In some embodiments, the capping layer 218 is a silicon (Si) layer, ruthenium (Ru) layer, Ru-containing layer. In some embodiments, the capping layer 218 has a thickness ranging between about 1 nm and about 10 nm. In alternative embodiments, the capping layer 218 has a thickness about 2.5 nm.

In some embodiments, the capping layer 218 is formed by a deposition process, including CVD, PVD, ALD, and/or other suitable process.

In some embodiments, the hard mask layer 220 includes Ru, RuSi, or a combination thereof. In one embodiment, the hard mask layer 220 has a thickness ranging between about 2 nm and about 15 nm. In another embodiment, the thickness of the hard mask layer 220 is about 5 nm. In some embodiments, the hard mask layer 220 is formed by CVD, PVD, ALD, and/or other suitable process.

Figure 3:
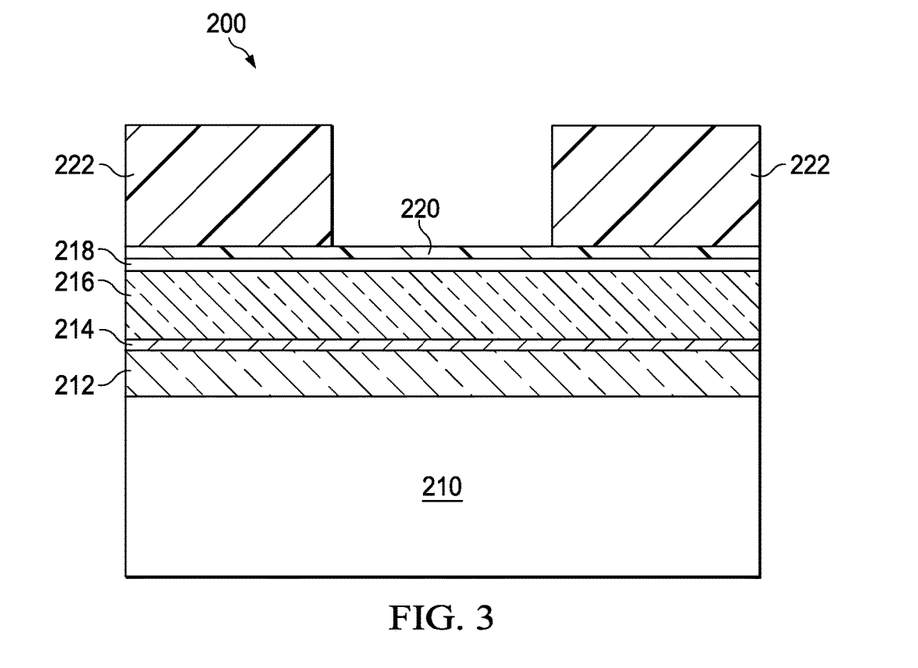
Figure 4:
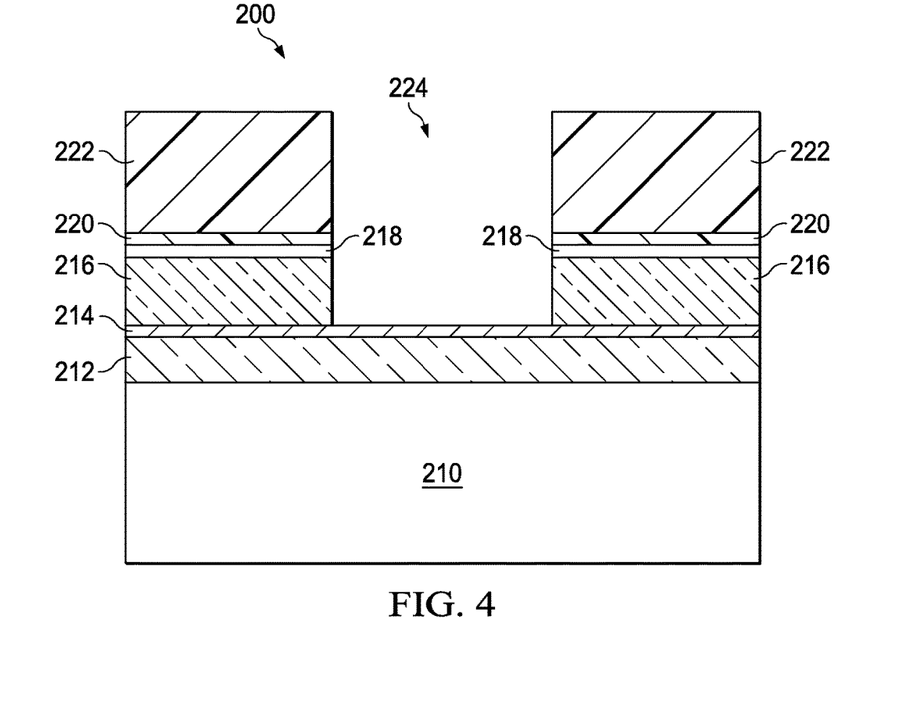

Referring to FIGS. 3, 4 and 9, the method 300 continues with step 304 wherein the second reflective layer 216 is subjected to a patterning process to form an opening 224 therein. In the present embodiment, the opening 224 is located within the hard mask layer 220, the capping layer 218, and the second reflective layer 216 (FIG. 4). The patterning process may include forming photoresist features 222 over the hard mask layer 220 and then removing the portion of the hard mask layer 220 uncovered by the photoresist features 222.

In some embodiments, the process for forming the photoresist features 222 includes forming a layer of photoresist (not shown) over the hard mask layer 220 by a suitable process, such as spin-on coating, and then exposing and developing the layer of photoresist to form the photoresist features 222 separated with a space (FIG. 3). The photoresist features 222 partially expose the underlying hard mask layer 220. Additionally, an anti-reflective coating (ARC) layer (not shown) may be optionally formed between the hard mask layer 220 and the layer of photoresist to enhance the patterning process.

Referring to FIG. 4, a removing process is performed to remove the portion of the hard mask layer 220 uncovered by the photoresist features 222 and thereby transfer the patterns of the photoresist features 222 to the underlying hard mask layer 220. In some embodiments, the removing process includes an etching process performed using halogen-based gas, e.g., Cl2, CHF3, CH3F, C4F8, CF4, SF6, CF3Cl, or mixtures thereof to remove the uncovered portion of the hard mask layer 220. Then the etching process stops on the underlying capping layer 218 and expose a portion of the capping layer 218.

Still referring to FIG. 4, a portion of the capping layer 218 and the second reflective layer 216 are then removed by a single or multiple etching processes to form the opening 224. In some embodiments, the intervening layer 214 functions as an etch stop layer during the etching process thereby the removing process stops on the intervening layer 214. In some embodiments, an etching selectivity between the second reflective layer 216 and the intervening layer 214 during the etching process for forming the opening 224 is greater than about 10 to ensure the controllability of the etching process.

In the present embodiment, the capping layer 218 and the second reflective layer 216 are patterned by a single dry etching process. In some embodiments, the single dry etching process is performed using chlorine-based gas, e.g., Cl2 or CCl4, to remove the portion of capping layer 218 uncovered by the patterned hard mask layer 220 to expose a portion of the underlying second reflective layer 216, and at least a portion of the underlying second reflective layer 216 is continuously removed after the removal of the capping layer 218. In another embodiment, at least a portion of the underlying second reflective layer 216 is removed by a separate etching process different from the etching process for patterning the capping layer 218. In some embodiments, the second reflective layer 216 is removed by using Cl2, F2, or mixture thereof. In some embodiments, the exposed portion of second reflective layer 216 is completely removed and stops on the surface of the intervening layer 214. In alternative embodiments, the exposed portion of second reflective layer 216 is partially removed and stops within the second reflective layer 216.

The photoresist features 222 may be removed after the etching process of the hard mask layer 220, after the etching process of the capping layer 218, or after the etching process of the second reflective layer 216. In some embodiments, the removal of the photoresist features 222 is performed by implementing a wet stripping and/or plasma ashing known in the art. For example, an oxygen plasma ashing may be implemented to remove the photoresist features 218.

Figure 5:
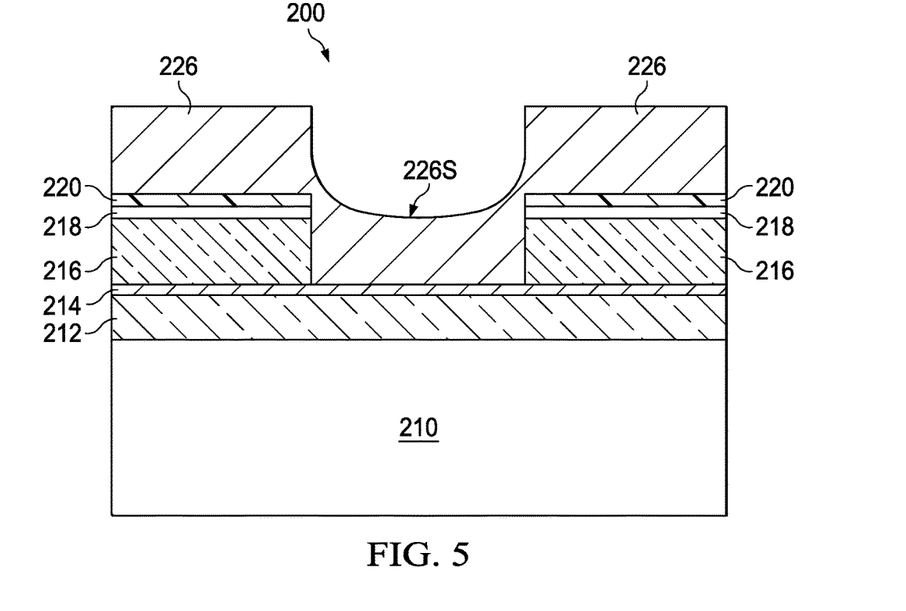

Referring to FIGS. 5 and 9, the method 300 continues with step 306 wherein an absorber layer 226 is filled in the opening 224 and above the top surface of the hard mask layer 220. The absorber layer 226 is an opaque, light-shielding layer and may have a thickness ranging between about 20 nm and about 100 nm. In one embodiment, the absorber layer 226 comprises tantalum-based materials with essentially no oxygen, such as tantalum silicide-based materials (hereinafter TaSi), nitrogenized tantalum boride-based materials (hereinafter TaBN), and tantalum nitride-based materials (hereinafter TaN). In another embodiment, the absorber layer 226 comprises tantalum- and oxygen-based materials, such as oxidized and nitrogenized tantalum and silicon-based materials (hereinafter TaSiON), tantalum boron oxide-based materials (hereinafter TaBO), and oxidized and nitrogenized tantalum-based materials (hereinafter TaON).

In some embodiments, the absorber layer 226 is formed by a deposition process. The deposition, for example, includes PVD such as sputtering and evaporation; plating; CVD such as plasma enhanced CVD (PECVD), atmospheric pressure CVD (APCVD), low pressure CVD (LPCVD), high density plasma CVD (HDPCVD), atomic layer CVD (ALCVD), other suitable deposition processes, and/or combinations thereof. In alternative embodiments, the absorber layer 226 is formed by a spin coating process. In the present embodiment, the absorber layer 226 is formed by a deposition process with an uneven surface 226S (FIG. 5).

Figure 6:
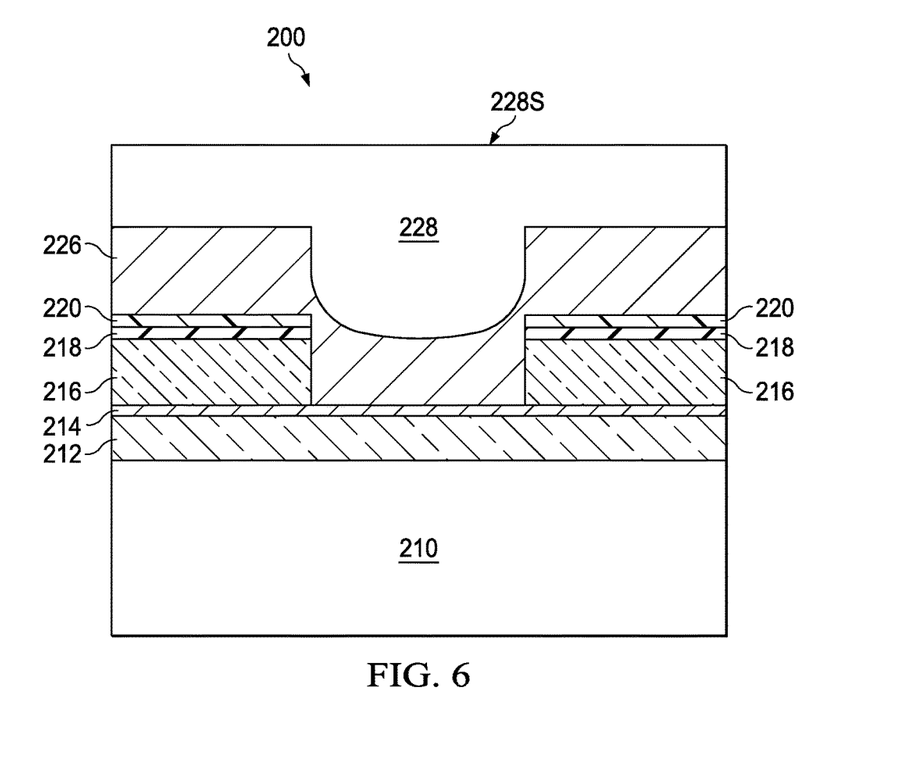

Referring to FIG. 6, a planarization layer 228 is formed on the absorber layer 226 with a planarized surface. In some embodiments, the planarization layer 228 is $Ag_2O_3$, Si-containing layer, Carbon-containing layer, or combinations thereof. The planarization layer 228, for example, is formed by a spin coating process. In the present embodiment, the planarization layer 228 has an etching rate similar to an etching rate of the underlying absorber layer 226 during a subsequent etching process. In some embodiments, the planarization layer 228 has a thickness that entirely covers the absorber layer 226. In the present embodiment, the planarization layer 228 has a thickness that ranges from about 30 nm to about 150 nm. In alternative embodiments, the planarization layer 228 can be omitted if a planarized surface has already achieved by the absorber layer 226, for example, the absorber layer 226 is formed by a spin coating process.

Figure 7:
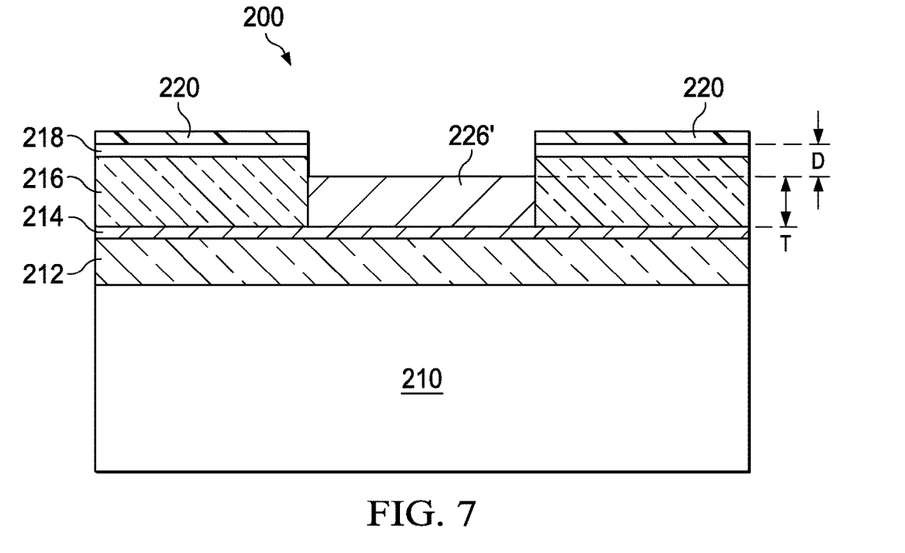

Referring to FIGS. 7 and 9, the method 300 continues with step 308 wherein a process is provided to remove at least a portion of the absorber layer 226, while leaving another portion of the absorber layer 226 to form an absorber 226' in the second reflective layer 216. In the present embodiment, the planarization layer 228 is removed before removing the portion of the absorber layer 226. The processes for removing the planarization layer 228 and the absorber layer 226, for example, is performed using a single etching process. The removed portion of the absorber layer 226 includes, for example, the portion of the absorber layer 226 above the opening 224 and above the hard mask layer 220. In some embodiments, a portion of the absorber layer 226 in the opening 224 is removed to form the absorber 226' with a top surface substantially lower than the top surface of the capping layer 218. A height difference D is present between the top surface of the absorber 226' and the top surface of capping layer 218. In the present embodiment, the absorber 226' has a top surface substantially lower than the top surface of the second reflective layer 216.

The height difference D, for example, is greater than about 20 nm to secure the particles on the absorber 226' against falling on the reflective layer 216 during wafer lithography process. In the present embodiment, the height difference D ranges between about 20 nm and about 50 nm. In some embodiments, the absorber 226' has a thickness T greater than about 20 nm to prevent light leakage or poor contrast during wafer lithography process. In an alternative embodiment, the thickness T is less than about 150 nm to prevent the difficulty of fabricating the mask. In the present embodiment, the thickness T ranges between about 20 nm and about 150 nm.

In some embodiments, the removing process includes a dry etching process by $CF_4$, $Cl_2$, or a mixture thereof. In alternative embodiment, the removing process includes a chemical-mechanical polish (CMP) process by using fluoride-base slurry. In other embodiment, the removing process is conducted by a CMP process first to remove a portion of the absorber layer 226 and leave some of the absorber layer 226 above the opening 224 and the hard mask layer 220. Then, a dry etching process is provided to remove the additional absorber layer 226 over and in the opening 224, while leaving another portion of the absorber layer 226 in the opening 224 to form the absorber 226'. During the CMP or the dry etching process, the hard mask layer 220 may act as a stop layer to stop the CMP or the dry etching process thereon. The top surface of the absorber 226' may be substantially planarized when the planarization layer 228 has an etching rate similar to the etching rate of the absorber layer 226 during the dry etching process. For example, a ratio of the etching rate of the planarization layer 228 to the etching rate of the absorber layer 226 ranges from about 0.8 to about 1.2.

Figure 8:
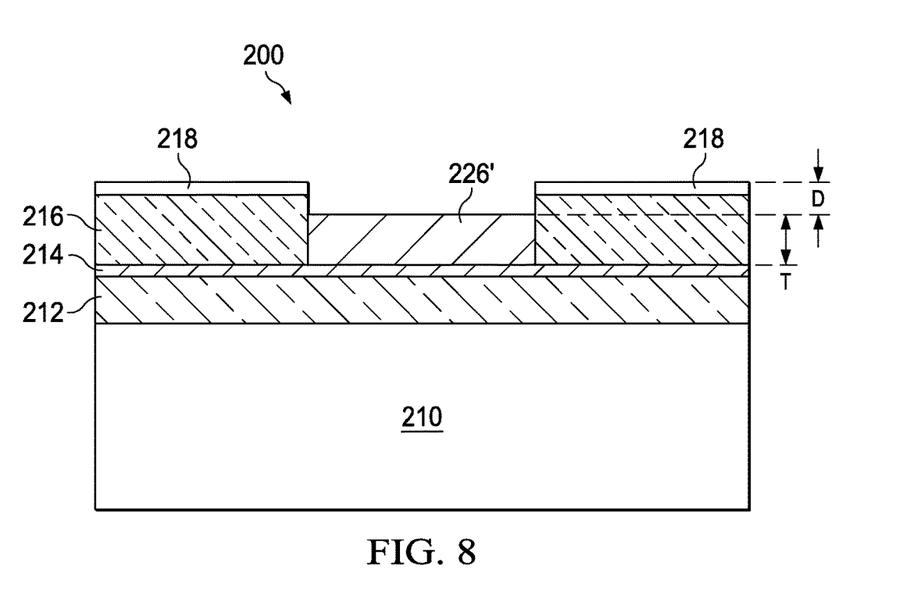

Referring to FIG. 8, the hard mask layer 220 is removed after forming the absorber 226'. In some embodiments, the removing process includes a dry etching process. The dry etching process is performed using, for example, halogen-based etching gas, including F-containing gas, e.g., $CF_4$, $SF_6$, $CHF_3$, Cl-containing gas, e.g., $Cl_2$, $CCl_4$, or Br-containing gas, e.g., HBr, $Br_2$. Dilute gas, such as He or Ar, may be added in the etching gas during the etching process. In alternative embodiments, the removing process is wet etching process or CMP.

Figure 10:
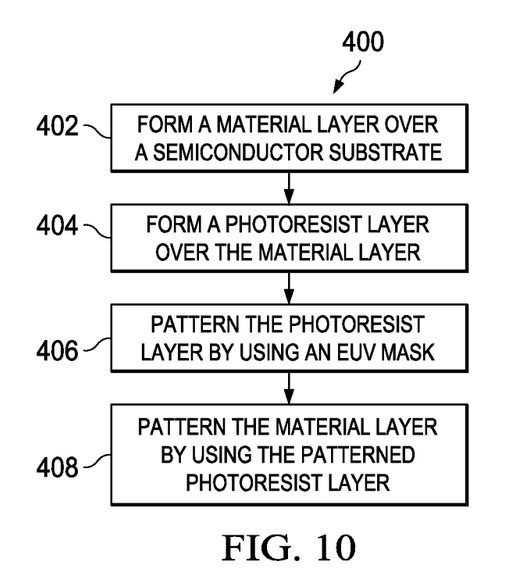
FIG. 10 is a flow chart of a method for fabricating an integrated circuit device by using an EUV mask according to aspects of the present disclosure.

Referring to FIG. 10, a flow chart of a method 400 for fabricating an integrated circuit device by using an EUV mask is described below. The method 400 begins at step 402 wherein a semiconductor substrate having a material layer is provided. The method 400 continues with step 404 to form a photoresist layer over the material layer. Then, the method 400 continues with step 406 to pattern the photoresist layer by using an EUV mask as described above in a lithography process. The method 400 continues with step 408 to pattern the material layer by using the patterned photoresist layer as an etch mask.

It is noted that the EUV masks with the planarized surface are easily cleaned. In addition, dust-monitoring processes are easily performed on the EUV masks having the planarized surface. Furthermore, optical performance, e.g., particle issue, may be improved by adopting the absorber with a top surface lower than a top surface of the capping layer or the reflective layer to secure the particles on the absorber against falling on the capping layer or the reflective layer during wafer lithography process.

It is noted that the integrated circuit devices processed by using the EUV masks are likely to prevent unwanted dusts or particles on the reflective layer to be transferred to the chip.

In one embodiment, a method of fabricating an extreme ultraviolet photomask, includes providing a mask comprising, in order, a substrate, a reflective layer, and a capping layer; forming an opening in the capping layer and at least a portion of the reflective layer; forming an absorber layer in the opening and over the top surface of the capping layer; and removing at least a portion of the absorber layer, while leaving another portion of the absorber layer to form a absorber. The absorber has a top surface lower than a top surface of the capping layer.

In another embodiment, an extreme ultraviolet photomask, includes a reflective layer over a substrate; a capping layer over the reflective layer; and an absorber in the capping layer and the reflective layer. A top surface of the absorber is lower than a top surface of the capping layer.

In still another embodiment, a method for forming an integrated circuit includes forming a photomask by forming a reflective layer over a substrate, forming a capping layer over the reflective layer, and forming an absorber in the capping layer and the reflective layer; forming a layer on a substrate; and patterning the layer using the photomask in a photolithography step. A top surface of the absorber is lower than a top surface of the capping layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating an extreme ultraviolet photomask, comprising:
    forming on a substrate a reflective coating;
    forming over the reflective coating a capping layer;
    patterning the capping layer and the reflective coating to form an opening therein;
    at least partially filling the opening with an absorber layer, the absorber layer having a top surface; and
    recessing the top surface of the absorber layer to be at a level below a top surface of the capping layer.

2. The method of claim 1, wherein the absorber layer is formed atop a planar surface.

3. The method of claim 1, wherein the step of at least partially filling the opening with an absorber layer includes conformally depositing the absorber layer in the opening.

4. The method of claim 3, further comprising forming a planarization layer having a planar tops surface over the absorber layer prior to the step of recessing the top surface of the absorber layer.

5. The method of claim 1, wherein the step of recessing the top surface of the absorber layer includes applying a chemical mechanical polish to the top surface of the absorber layer followed by applying a dry etch process to the top surface of the absorber layer.

6. The method of claim 1, further comprising forming on the substrate another reflective coating and an intervening layer atop the another reflective coating prior to the step of forming on a substrate a reflective coating.

7. The method of claim 1, wherein the step of at least partially filling the opening with an absorber layer comprises depositing the absorber layer using a spin coating process.

8. A photolithography mask for use with extreme ultraviolet lithography (EUVL) that uses extreme ultraviolet (EUV) illuminating radiation, said mask comprising:
    a multilayer stack formed over a substrate, the multilayer stack being substantially reflective of said EUV illuminating radiation;
    a supplemental multilayer stack formed atop said multilayer stack; and
    an absorber material formed in trenches patterned into said supplemental multilayer stack, said absorber material being substantially absorptive of said EUV illuminating radiation and having a topmost surface below a topmost surface of said supplemental multilayer stack.

9. The photolithography mask of claim 8, further comprising a capping layer on the supplemental multilayer stack.

10. The photolithography mask of claim 8, further comprising an intervening layer interjacent the multilayer stack and the supplemental the multilayer stack.

11. The photolithography mask of claim 8, wherein said absorber material comprises a material selected from the group consisting of tantalum silicide-based materials, nitrogenized tantalum boride-based materials, tantalum nitride-based materials, oxidized and nitrogenized tantalum and silicon-based materials, tantalum boron oxide-based materials, and oxidized and nitrogenized tantalum-based materials.

12. The photolithography mask of claim 8, wherein the topmost surface of the absorber material is below a topmost surface of said supplemental multilayer stack by a distance of between about 20 nm and about 150 nm.

13. A method for forming a photolithography mask comprising:
    forming over a substrate a reflective coating;
    forming on the reflective coating a capping layer;
    patterning and etching trenches in said reflective coating; and
    forming an absorber layer into said trenches, said absorber layer having a topmost surface below a topmost surface of the reflective coating.

14. The method of claim 13, wherein the step of forming over a substrate a reflective coating comprises depositing alternating layers of Mo and Si.

15. The method of claim 13, further comprising forming a planarization layer over the absorber layer.

16. The method of claim 15, further comprising simultaneously removing a portion of the planarization layer and a portion of the absorber layer.

17. The method of claim 16, further comprising chemical mechanical polishing the absorber layer followed by dry etching the absorber layer.

18. The method of claim 16, further comprising forming an underlying reflective coating on the substrate and forming an intervening layer on the underlying reflective coating prior to forming the reflective coating.

19. The method of claim 13, wherein the absorber layer is depositing conformally in the trench and on over a topmost surface of the capping layer.

20. The method of claim 13, wherein the trenches extend through the capping layer and partly through the reflective coating.

* * * * *